(12) United States Patent
Zhang et al.

(10) Patent No.: US 10,147,770 B2
(45) Date of Patent: Dec. 4, 2018

(54) PIXEL STRUCTURE HAVING TRIANGULAR RED AND GREEN SUBPIXELS AND RHOMBIC BLUE SUBPIXELS

(71) Applicant: BOE TECHNOLOGY GROUP CO., LTD, Beijing (CN)

(72) Inventors: Baoxia Zhang, Beijing (CN); Danna Song, Beijing (CN); Cuili Gai, Beijing (CN); Junjie Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 282 days.

(21) Appl. No.: 15/031,159

(22) PCT Filed: Sep. 17, 2015

(86) PCT No.: PCT/CN2015/089878
§ 371 (c)(1),
(2) Date: Apr. 21, 2016

(87) PCT Pub. No.: WO2016/150117
PCT Pub. Date: Sep. 29, 2016

(65) Prior Publication Data
US 2018/0158883 A1  Jun. 7, 2018

(30) Foreign Application Priority Data
Mar. 26, 2015  (CN) .......................... 2015 1 0138272

(51) Int. Cl.
*H01L 27/32*  (2006.01)
(52) U.S. Cl.
CPC ...... *H01L 27/3216* (2013.01); *H01L 27/3218* (2013.01)
(58) Field of Classification Search
None
See application file for complete search history.

(56) References Cited

U.S. PATENT DOCUMENTS

| 2004/0217694 A1 | 11/2004 | Cok et al. |
| 2008/0001525 A1 | 1/2008 | Chao et al. |

(Continued)

FOREIGN PATENT DOCUMENTS

| CN | 1551383 A | 12/2004 |
| CN | 102956840 A | 3/2013 |

(Continued)

OTHER PUBLICATIONS

The World Intellectual Property Organization (WIPO) International Search Report and Written Opinion for PCT/CN2015/089878 dated Dec. 18, 2015 12 Pages.

(Continued)

*Primary Examiner* — Daniel Whalen
(74) *Attorney, Agent, or Firm* — Anova Law Group, PLLC (57) ABSTRACT

The present disclosure provides a pixel structure, a display panel, and a display apparatus. The pixel structure includes a plurality of subpixels. The subpixels include red subpixels, green subpixels, and blue subpixels. The red subpixels and the green subpixels are all substantially in an isosceles triangular shape and have substantially a same area. Each blue subpixel is in substantially a rhombic shape and has an area substantially twice the area of the red subpixel or green subpixel. Each leg of the isosceles triangular shape of the red or green subpixel has a length equal to a side length of the rhombic shape of the blue subpixel. The display panel using the subpixel rendering algorithm has visual resolution greater than physical resolution. The enlarged blue subpixel extends life span to make all three color subpixel have similar life span.

18 Claims, 8 Drawing Sheets

(56) References Cited

U.S. PATENT DOCUMENTS

| | | | |
|---|---|---|---|
| 2013/0049032 A1 | 2/2013 | Matsumi et al. | |
| 2013/0063330 A1 | 3/2013 | Eom | |
| 2013/0112960 A1 | 5/2013 | Chaji et al. | |
| 2014/0001447 A1 | 1/2014 | Kim et al. | |
| 2014/0247200 A1 | 9/2014 | Jinta et al. | |
| 2015/0009104 A1 | 1/2015 | Kim et al. | |
| 2015/0021637 A1* | 1/2015 | Ahn | H01L 27/3218 |
| | | | 257/89 |
| 2015/0090985 A1 | 4/2015 | Park et al. | |
| 2016/0260781 A1 | 9/2016 | Yang et al. | |
| 2016/0275858 A1 | 9/2016 | Wang et al. | |
| 2016/0300520 A1 | 10/2016 | Wang | |
| 2016/0329385 A1* | 11/2016 | Qiu | H01L 27/3216 |

FOREIGN PATENT DOCUMENTS

| | | |
|---|---|---|
| CN | 103000654 A | 3/2013 |
| CN | 103515540 A | 1/2014 |
| CN | 103927945 A | 7/2014 |
| CN | 104009066 A | 8/2014 |
| CN | 104036700 A | 9/2014 |
| CN | 104037193 A | 9/2014 |
| CN | 104037199 A | 9/2014 |
| CN | 104269431 A | 1/2015 |
| CN | 104299523 A | 1/2015 |
| CN | 104716163 A | 6/2015 |
| CN | 104716167 A | 6/2015 |
| WO | 2016150117 A1 | 9/2016 |
| WO | 2016165278 A1 | 10/2016 |

OTHER PUBLICATIONS

State Intellectual Property Office of the P.R.C (SIPO) Office Action 1 for 2015101382722 dated May 4, 2017 18 Pages.
The World Intellectual Property Organization (WIPO) International Search Report and Written Opinion for PCT/CN2015/089928 dated Dec. 31, 2015 p. 1-12.
State Intellectual Property Office of the P.R.C (SIPO) Office Action 1 for 2015101732980 dated May 3, 2017 8 Pages.
Korean Intellectual Property Office (KIPO) Office Action 1 for 10-2016-7031347 dated Nov. 20, 2017 13 Pages.

* cited by examiner

PIXEL STRUCTURE HAVING TRIANGULAR RED AND GREEN SUBPIXELS AND RHOMBIC BLUE SUBPIXELS

CROSS-REFERENCES TO RELATED APPLICATIONS

This application is a national phase entry under 35 U.S.C. § 371 of International Application No. PCT/CN2015/089878, filed on Sep. 17, 2015, which claims priority to Chinese Patent Application No. CN201510138272.2, filed on Mar. 26, 2015, The above enumerated patent applications are incorporated by reference herein in their entirety.

FIELD OF THE DISCLOSURE

The present disclosure generally relates to the field of display technologies and, more particularly, relates to a pixel structure, a display panel including the pixel structure, and a display apparatus including the display panel.

BACKGROUND

Figure 1:
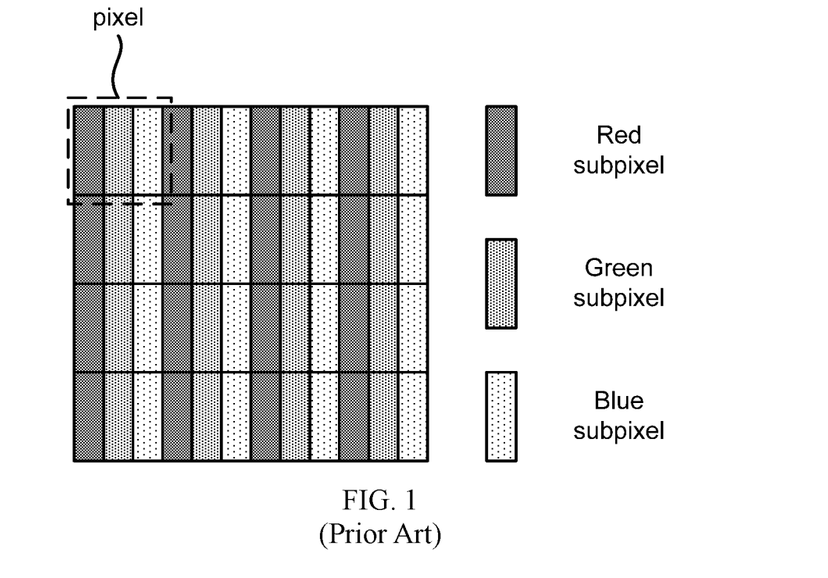
FIG. 1 illustrates a conventional pixel structure.

A conventional display substrate is often configured with pixels each including red, green and blue (RGB) subpixels that are repetitively arranged. As shown in FIG. 1, each pixel occupies identical area. Each pixel includes red, green and blue subpixels arranged horizontally. Each subpixel occupies identical area. The display substrate configured with such pixel structure may have a visual resolution same as physical resolution.

Demands for higher visual resolution continue to grow in the display substrate market. Display substrates may include organic light-emitting diode (OLED). However, it is often difficult in patterning organic light-emitting materials used in OLEDs. In addition, when manufacturing OLED subpixels using conventional subpixel arrangements, the organic light emitting material must be tightly integrated. Especially when producing a high resolution OLED display substrate, the subpixels made of organic light emitting materials must be made in very small size and densely integrated. This requires complicated manufacturing process with high production cost.

Typically, OLED subpixels include red, green and blue subpixels. The blue subpixels have relatively shorter lifespan than the red and green subpixels. Over the time of using, the brightness of the emitted-light of the blue subpixels may be reduced without being able to provide sufficient blue color when displaying images.

Directed to at least partially alleviate one or more problems set forth above and other problems in the art, the present disclosure provides a pixel structure, a display panel including the pixel structure, and a display apparatus including the display panel to increase the resolution of the display substrate and to extend the lifespan of blue subpixels.

BRIEF SUMMARY OF THE DISCLOSURE

One aspect of the present disclosure provides a pixel structure. The pixel structure includes a plurality of subpixels. The subpixels include red subpixels, green subpixels, and blue subpixels. The red subpixels and the green subpixels are all substantially in an isosceles triangular shape and have substantially a same area. Each blue subpixel is in substantially a rhombic shape and has an area substantially twice the area of the red subpixel or green subpixel. Each leg of the isosceles triangular shape of the red or green subpixel has a length equal to a side length of the rhombic shape of the blue subpixel.

Optionally, two of the red subpixels and two of the green subpixels are respectively arranged against four sides of the rhombic shape of the blue subpixel. Optionally, the pixel structure includes a plurality of logical pixels that are in a triangular shape, an arrow shape, a parallelogram shape, or a rectangular shape.

Optionally, each logical pixel is in the rectangular shape formed by a half red subpixel, a half green subpixel, and a half blue subpixel, and wherein a leg of the half red subpixel and a leg of the green subpixel are arranged against adjacent sides of the half blue subpixel, so as to form the rectangular shape.

Optionally, each logical pixel is in the triangular shape having one leg of the red subpixel and one leg of the green subpixel arranged against adjacent sides of the blue subpixel, and one base angle of the red subpixel is connected to one base angle of the green subpixel.

Optionally, each logical pixel is in the arrow shape having one leg of the red subpixel and one leg of the green subpixel arranged against adjacent sides of the blue subpixel, and vertex angles of the red subpixel and the green subpixel are connected to one another.

Optionally, each logical pixel is in the parallelogram shape having one leg of the red subpixel and one leg of the green subpixel arranged against opposite sides of the blue subpixel.

Optionally, the blue subpixel in substantially the rhombic shape is a single subpixel. Optionally, the blue subpixel in substantially the rhombic shape includes two separate isosceles triangular shapes each having a shape substantially same as the isosceles triangular shape of the red subpixel or the green subpixel.

Optionally, the plurality of logical pixels are all substantially in a triangular shape, and the plurality of logical pixels include a plurality of first logical pixels and a plurality of second logical pixels. In the first logical pixel, the red subpixel is located at a lower left corner of the blue subpixel and the green subpixel is located at a lower right corner of the blue subpixel. In the second logical pixel, the red subpixel is located at an upper right corner of the blue subpixel and the green subpixel is located in an upper left corner of the blue subpixel.

Optionally, a plurality of first repeating units are arranged in a pre-set layout. The first repeating unit includes the first logical pixel and the second logical pixel, that are horizontally arranged, and a side of the first logical pixel is arranged against a side of the second logical pixel.

Optionally, a plurality of second repeating units are arranged in a pre-set layout. The second repeating unit includes the first logical pixel and the second logical pixel, that are vertically arranged, and a bottom side of the first logical pixel is arranged against a bottom side of the second logical pixel.

Optionally, the plurality of logical pixels are all substantially in a triangular shape, and the plurality of logical pixels include a plurality of third logical pixels and a plurality of fourth logical pixels. In the third logical pixel, the green subpixel is located at a lower left corner of the blue subpixel and the red subpixel is located at a lower right corner of the blue subpixel. In the fourth logical pixel, the green subpixel is located at an upper right corner of the blue subpixel and the red subpixel is located in an upper left corner of the blue subpixel.

Optionally, a plurality of third repeating units are arranged in a pre-set layout. The third repeating unit includes the third logical pixel and the fourth logical pixel, that are horizontally arranged, and a side of the third logical pixel is arranged against a side of the fourth logical pixel.

Optionally, a plurality of fourth repeating units are arranged in a pre-set layout. The fourth repeating unit includes the third logical pixel and the fourth logical pixel, that are vertically arranged, and a bottom side of the third logical pixel is arranged against a bottom side of the fourth logical pixel.

Optionally, the isosceles triangular shape for the red subpixel or the green subpixel has an equilateral triangular shape.

Another aspect of the present disclosure provides a display panel. The display panel includes the disclosed pixel structures. Another aspect of the present disclosure provides a display apparatus. The display apparatus includes the disclosed display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present disclosure and not to limit the disclosure. Wherever possible, the disclosed embodiments and the features disclosed in the exemplary embodiments may be re-arranged without departing from the scope of the present disclosure.

Figure 2A:
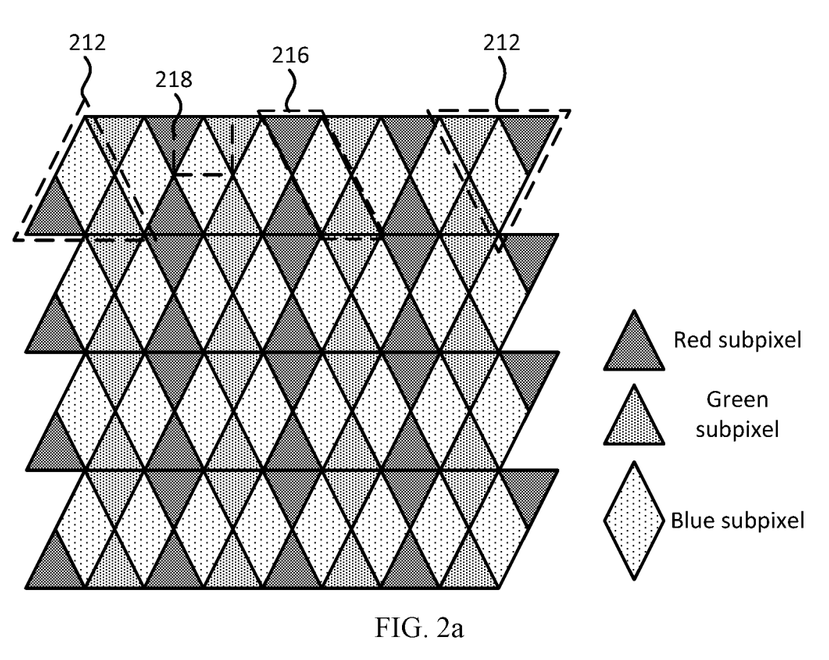
FIGS. 2a-2b illustrate exemplary pixel structures according to various disclosed embodiments.
Figure 2B:
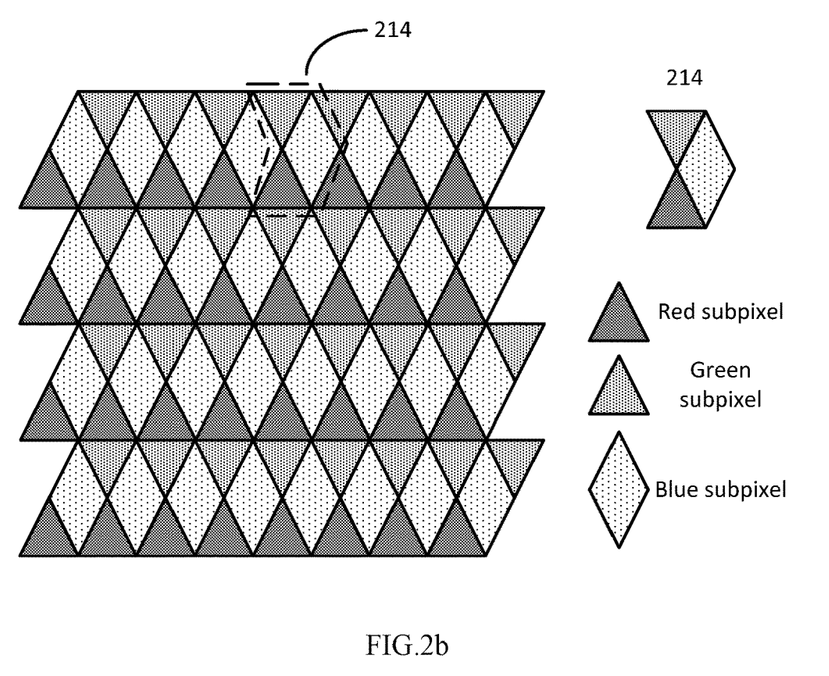

Referring to FIGS. 2a-2b, the present disclosure provides a pixel structure, for example, based on a subpixel borrowing mechanism. The pixel structure may include a plurality of subpixels, for example, including red subpixels, green subpixels and blue subpixels. The subpixel rendering algorithm may be used to drive the red, green and blue subpixels. The red subpixel may have the same area/shape as the green subpixel. The blue subpixel may have twice the area of the red or green subpixel.

Because the blue subpixel has twice the area of the red or green subpixel, the area of the blue subpixel may be enlarged to extend the lifespan of the blue subpixel to make all three color subpixels have substantially same or similar lifespan. The enlarged blue subpixel may also provide sufficient intensity of blue light from the blue subpixel in each logical pixel. Such blue light may be combined with the red light from the red subpixel and the green light from the green subpixel to form various different colors. Further, by taking into the account the physical properties of the actual pixel structure, the subpixel rendering algorithm may be used to drive the pixel structure to perform subpixel rendering such that the visual resolution of images displayed by the pixel structure is greater than the physical resolution of the pixel structure.

Figure 3:
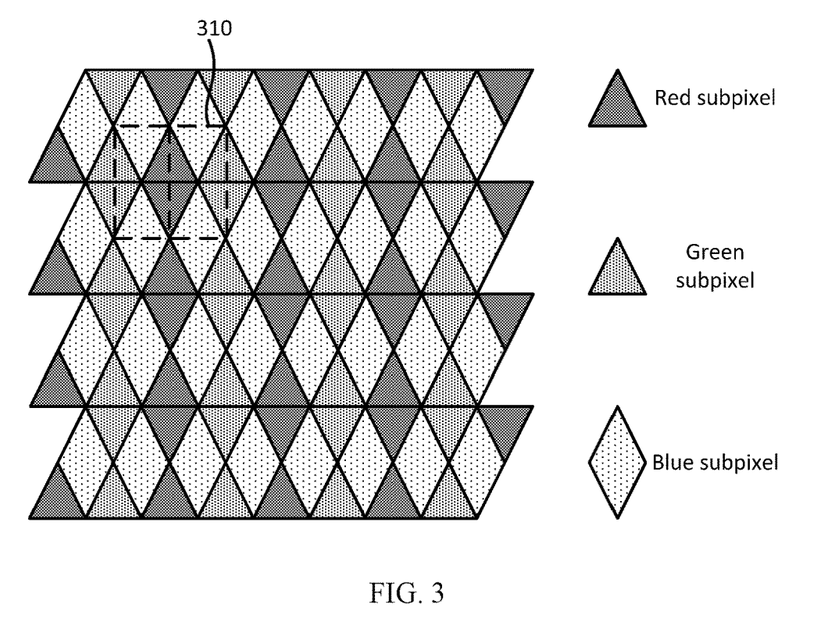
FIG. 3 illustrates another exemplary pixel structure according to various disclosed embodiments.

FIG. 3 illustrates an exemplary pixel structure for displaying an image in a 2×2 arrangement according to the present disclosure. For example, an image unit in each row or each column of the 2×2 arrangement 310 shown in FIG. 3 may include one half blue subpixel, one half green subpixel, and one half red subpixel, which in total includes 3/2 subpixels. Accordingly, the exemplary pixel structure for displaying the image in the 2×2 arrangement 310 includes 3/2*4=6 subpixels. In contrast, a conventional pixel structure for displaying an image in a 2×2 arrangement includes 3*4=12 subpixels. Thus, in one embodiment, the present disclosure increases the pixel resolution by 12/6=2 times as compared to the convention pixel structure.

Preferably, the blue subpixel may be in a rhombic or diamond shape. The red subpixel and the green subpixel may be in an isosceles triangular shape. The equal legs of the isosceles triangular of the red subpixel or the green subpixel may have a length equal to the side length of the rhombic shape. In one embodiment, each logical pixel, formed by the blue subpixel, the red subpixel, and the green subpixel, has a triangular shape.

In various embodiments, in the disclosed pixel structure, two of the red subpixels and two of the green subpixels are respectively arranged against four sides of the rhombic shape of the blue subpixel. The pixel structure may include, e.g., may be formed of or divided into, a plurality of logical pixels that are in a triangular shape, an arrow shape, a parallelogram shape, or a rectangular shape, for example, as illustrated in FIGS. 2a-2b. In some embodiments, the term "logical pixel" can be interchangeable with the term "pixel".

Referring back to FIG. 2a, an exemplary logical pixel 212 is in the triangular shape having one leg of the red subpixel and one leg of the green subpixel arranged against adjacent sides of the blue subpixel. As shown, one base angle of the red subpixel is connected to one base angle of the green subpixel and connected to the angle made by adjacent sides of the blue subpixel.

Referring back to FIG. 2b, an exemplary logical pixel 214 is in the arrow shape having one leg of the red subpixel and one leg of the green subpixel arranged against adjacent sides of the blue subpixel. Vertex angles of the red subpixel and the green subpixel are connected to the angle made by adjacent sides of the blue subpixel.

Referring back to FIG. 2a, an exemplary logical pixel 216 is in the parallelogram shape having one leg of the red subpixel and one leg of the green subpixel arranged against opposite sides of the blue subpixel.

Still in FIG. 2a, an exemplary logical pixel 218 is in the rectangular shape, e.g., including a square shape, formed by a half red subpixel, a half green subpixel, and a half blue subpixel. A leg of the half red subpixel and a leg of the green subpixel are arranged against adjacent sides of the half blue subpixel.

In various embodiments, the disclosed pixel structure may include a combination of the same logical pixels, for example, including logical pixels 212, 214, 216, or 218 shown in FIGS. 2a-2b.

In some embodiments, the blue subpixel in substantially the rhombic shape may be a single subpixel, driven by one electrode. In other embodiments, the blue subpixel in substantially the rhombic shape may include separated two portions such as two isosceles triangular shapes each having a shape or area substantially same as the isosceles triangular shape of the red subpixel or the green subpixel.

In various embodiments, the separated two portions may be symmetrically configured to form the blue subpixel. The separated two portions of the blue subpixel may be driven by separate electrodes to apply same or different voltages there-to. For example, the separated two portions of the blue subpixel may be driven separately but simultaneously by applying low voltages to each of the separated two portions of the blue subpixel. In another example, a voltage may be applied to one of the separated two portions, such as a first isosceles triangular, of the blue subpixel, without using the other of the separated two portions, such as a second isosceles triangular of the blue subpixel. In this case, the second isosceles triangular may be used as a backup subpixel to compensate the first isosceles triangular when aging of the emitted blue light occurs.

Figure 4:
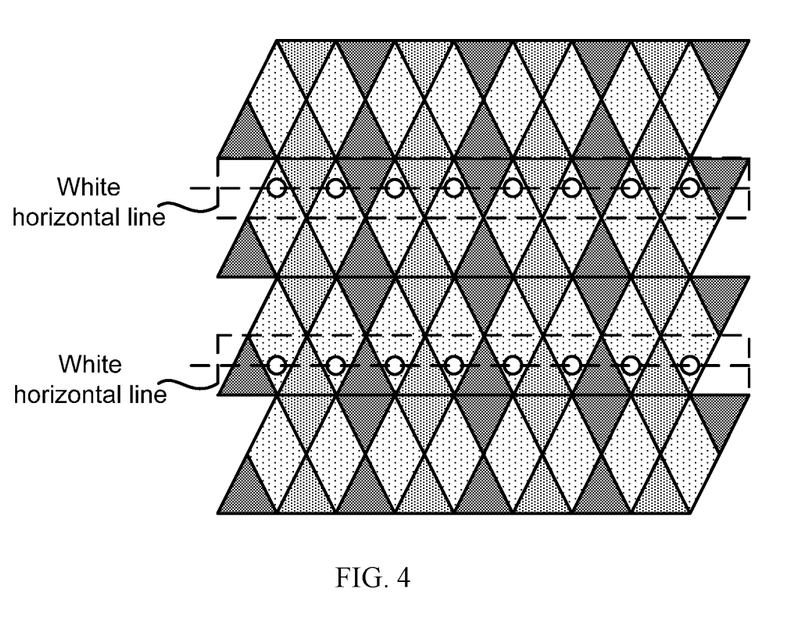
FIG. 4 illustrates another exemplary pixel structure for displaying horizontal white lines according to various disclosed embodiments.

FIG. 4 illustrates an exemplary pixel structure for displaying a horizontal white line according to the present disclosure. As shown in FIG. 4, when displaying a horizontal white line, the center points of the horizontal white line in a width direction may have two forms of position distribution. In one form, the center points may be located in the upper half of the horizontally arranged blue subpixels. In another form, the center points may be located in the lower half of the horizontally arranged blue subpixels. In one embodiment, the displayed horizontal white line has a width that is half of a height of a pixel.

Figure 5:
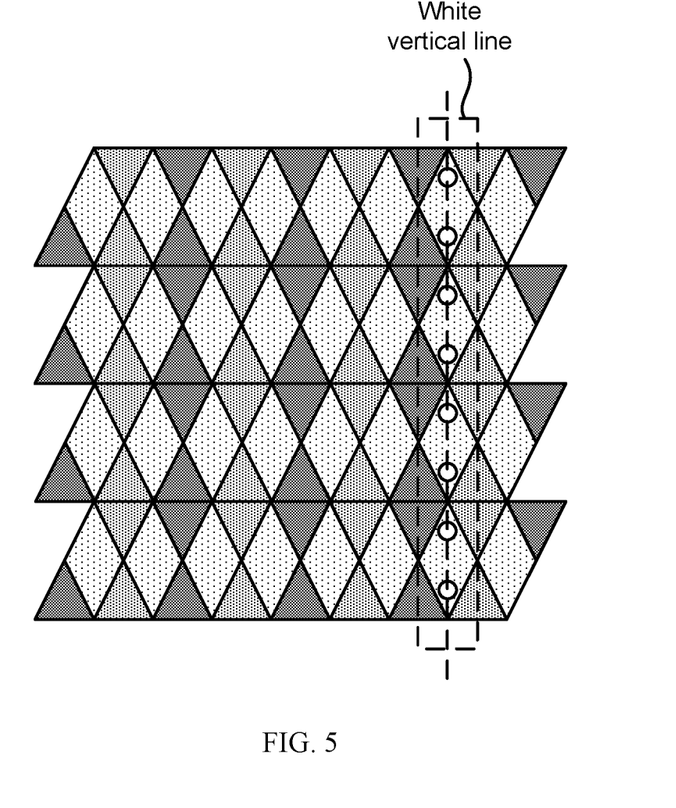
FIG. 5 illustrates another exemplary pixel structure for displaying vertical white line according to various disclosed embodiments.

FIG. 5 illustrates an exemplary pixel structure for displaying a vertical white line according to the present disclosure. As shown in FIG. 5, when displaying a vertical white line, the center points of the vertical white line in a width direction may only have one form of position distribution, i.e., the center points are located in the vertically arranged blue subpixels. In one embodiment, the displayed vertical white line has a width that is a width of a pixel at a middle point of the height.

Preferably, as also shown in FIGS. 2a-2b, the red subpixels may be located at the lower left corner of the blue subpixels and the green subpixels may be located at the lower right corner of the blue subpixels. Alternatively, the red subpixels may be located at the upper right corner of the blue subpixels and the green subpixels may be located in the upper left corner of the blue subpixels.

Various embodiments may include various repeating units used as building blocks to form pixel structures. Each repeating unit may include a number of pixels, such as two pixels.

In one embodiment, a pixel structure may include a plurality of first exemplary repeating units used as building blocks and arranged according to a pre-set layout. The first exemplary repeating unit may include a first logical pixel and a second logical pixel, arranged horizontally. One side of the first logical pixel is arranged against a side of the second logical pixel in a horizontal direction. The first logical pixel may include a blue subpixel, a red subpixel located at the lower left corner of the blue subpixel and a green subpixel located at the lower right corner of the blue subpixel. The second logical pixel may include a blue subpixel, a red subpixel located at the upper right corner of the blue subpixel and a green subpixel located at the upper left corner of the blue subpixel.

Figure 6:
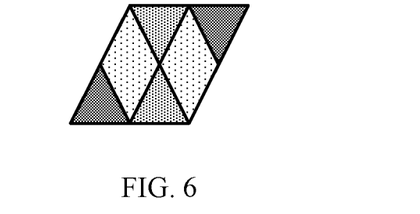
FIG. 6 illustrates an exemplary first repeating unit according to various disclosed embodiments.
Figure 7:
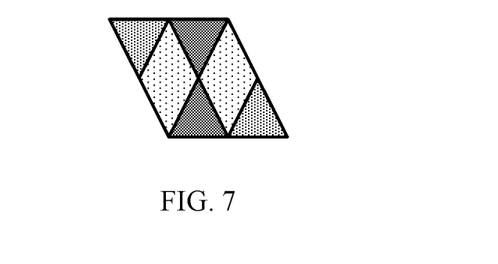
FIG. 7 illustrates another exemplary first repeating unit according to various disclosed embodiments.
Figure 8:
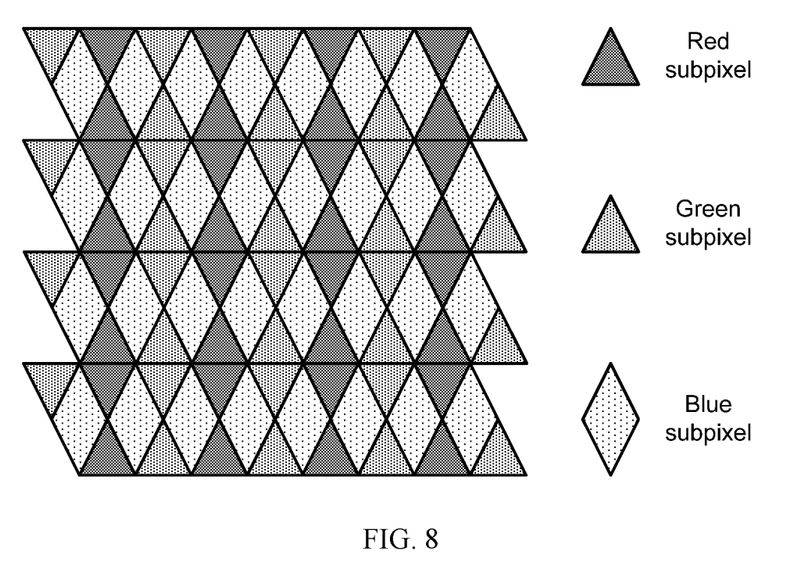
FIG. 8 illustrates another exemplary pixel structure including the first repeating unit according to various disclosed embodiments.

FIG. 6 illustrates an exemplary first repeating unit according to the present disclosure. FIG. 7 illustrates another exemplary first repeating unit according to the present disclosure. The first repeating unit in FIG. 6 may be used to form the pixel structure as shown in FIGS. 2a-2b. The first repeating unit in FIG. 7 may be used to form the pixel structure as shown in FIG. 8.

Referring back to FIG. 6, the two green subpixels in the two pixels are vertically arranged and aligned with one another. As shown in FIG. 7, the two red subpixels in the two pixels are vertically arranged and aligned with one another. The exemplary first repeating units illustrated in FIGS. 6-7, each formed by two pixels, may have edge protrusions arranged in different directions, and may be used according to specific applications.

Various embodiments may provide a second exemplary repeating unit used as building blocks to form a pixel structure. The second exemplary repeating unit may include a first logical pixel and a second logical pixel, each arranged vertically. The bottom side (or base side) of the first logical pixel may be arranged against the bottom side (or base side) of the second logical pixel. The first logical pixel may include a blue subpixel, a red subpixel located at the lower left corner of the blue subpixel and a green subpixel located at the lower right corner of the blue subpixel. The second logical pixel may include a blue subpixel, a red subpixel located at the upper right corner of the blue subpixel and a green subpixel located at the upper left corner of the blue subpixel.

Figure 9:
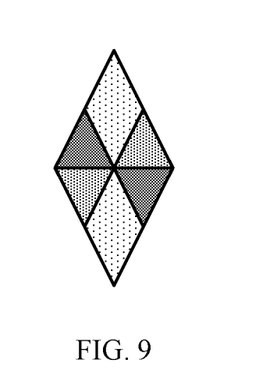
FIG. 9 illustrates an exemplary second repeating unit according to various disclosed embodiments.
Figure 10:
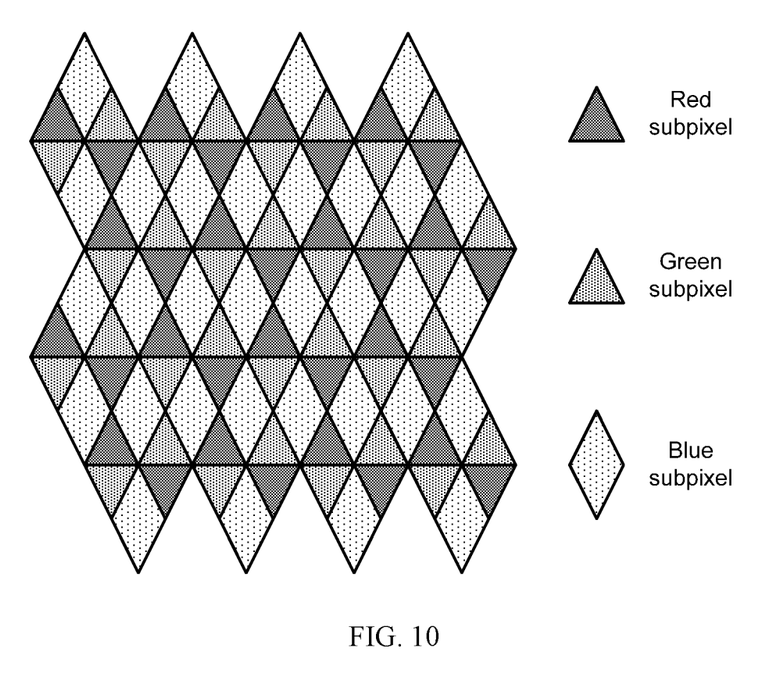
FIG. 10 illustrates another exemplary pixel structure including the second repeating unit according to various disclosed embodiments.

FIG. 9 illustrates an exemplary second repeating unit according to the present disclosure. The second repeating unit in FIG. 9 may be used to form the pixel structure as shown in FIG. 10.

As shown in FIG. 9, the second repeating unit may be rapidly arranged in the vertical direction to form a pixel structure. As shown in FIGS. 6-7, the first repeating unit may be rapidly arranged in the horizontal direction to form a pixel structure. Depending on specific applications, pixel structures may be formed by the first exemplary repeating unit in FIGS. 6-7 and/or the second exemplary repeating unit in FIG. 9.

Figure 11:
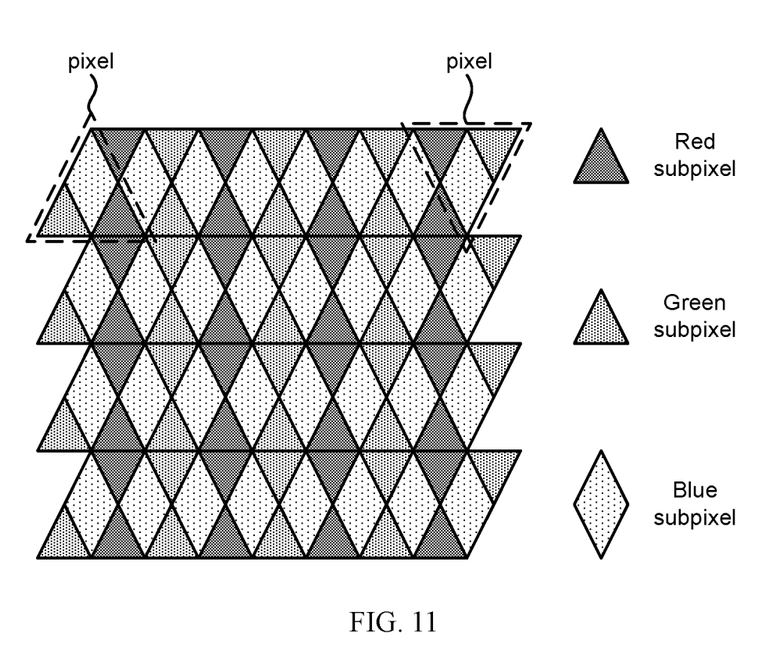
FIG. 11 illustrates another exemplary pixel structure according to various disclosed embodiments.

Preferably, as shown in FIG. 11, the green subpixels may be located at the lower left corner of the blue subpixels and the red subpixels may be located at the lower right corner of the blue subpixels. Alternatively, the green subpixels may be located at the upper right corner of the blue subpixels and the red subpixels may be located in the upper left corner of the blue subpixels.

Various embodiments may provide a third exemplary repeating unit used as building blocks to form a pixel structure. The third exemplary repeating unit may include a third logical pixel and a fourth logical pixel, arranged horizontally. One side of the third logical pixel is arranged against a side of the fourth logical pixel in a horizontal direction. The third logical pixel may include a blue subpixel, a green subpixel located at the lower left corner of the blue subpixel and a red subpixel located at the lower right corner of the blue subpixel. The fourth logical pixel may include a blue subpixel, a green subpixel located at the upper right corner of the blue subpixel and a red subpixel located at the upper left corner of the blue subpixel.

Figure 12:
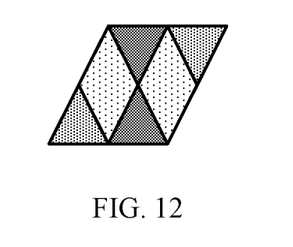
FIG. 12 illustrates an exemplary third repeating unit according to various disclosed embodiments.
Figure 13:
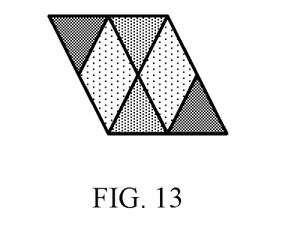
FIG. 13 illustrates another exemplary third repeating unit according to various disclosed embodiments.
Figure 14:
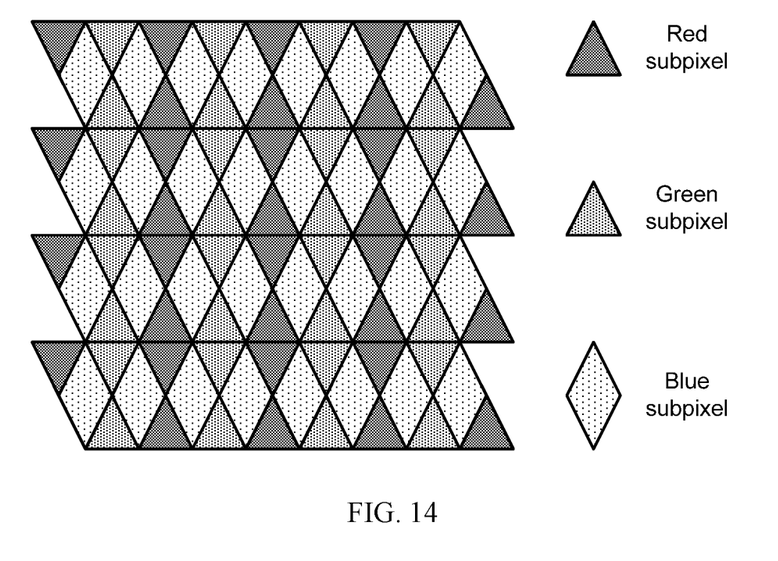
FIG. 14 illustrates another exemplary pixel structure including the third repeating unit according to various disclosed embodiments.

FIG. 12 illustrates an exemplary third repeating unit according to the present disclosure. FIG. 13 illustrates another exemplary third repeating unit according to the present disclosure. The third repeating unit in FIG. 12 may be used to form the pixel structure as shown in FIG. 11. The third repeating unit in FIG. 13 may be used to form the pixel structure as shown in FIG. 14.

As shown in FIG. 12, the two red subpixels in the two pixels are vertically arranged and vertically aligned with one another. As shown in FIG. 13, the two green subpixels in the two pixels are vertically arranged and vertically aligned with one another. The exemplary third repeating units illustrated in FIGS. 12-13, each formed by two pixels, may have edge protrusions arranged in different directions, and may be used according to specific applications.

Various embodiments may provide a fourth exemplary repeating unit used as building blocks to form a pixel structure. The exemplary fourth repeating unit may include a third logical pixel and a fourth logical pixel, arranged and aligned vertically. The bottom side of the third logical pixel may be arranged against the bottom side of the fourth logical pixel. The third logical pixel may include a blue subpixel, a green subpixel located at the lower left corner of the blue subpixel and a red subpixel located at the lower right corner of the blue subpixel. The fourth logical pixel may include a blue subpixel, a green subpixel located at the upper right corner of the blue subpixel and a red subpixel located at the upper left corner of the blue subpixel.

Figure 15:
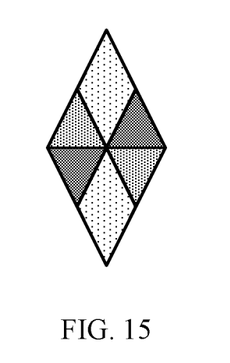
FIG. 15 illustrates an exemplary fourth repeating unit according to various disclosed embodiments.
Figure 16:
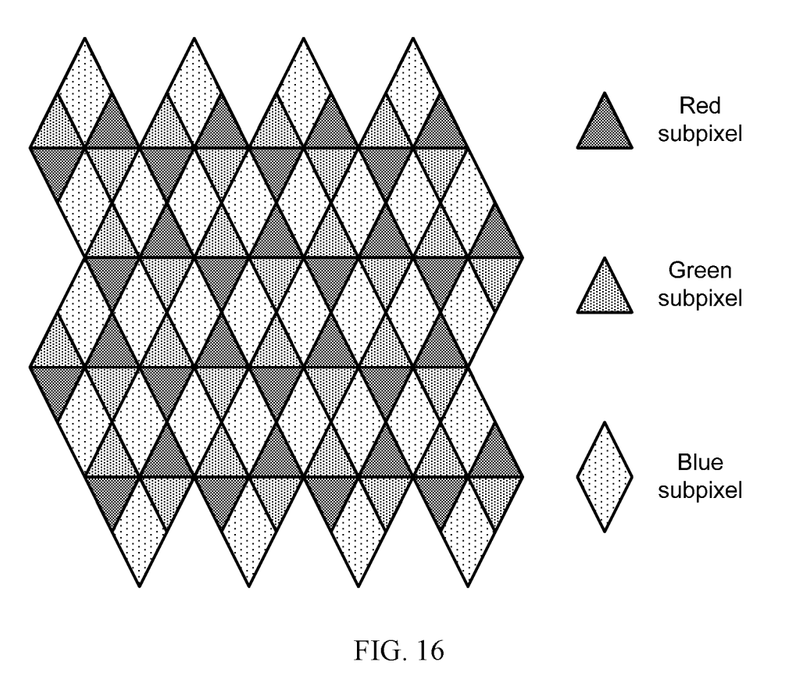
FIG. 16 illustrates another exemplary pixel structure including the fourth repeating unit according to various disclosed embodiments.

FIG. 15 illustrates an exemplary fourth repeating unit according to the present disclosure. The fourth exemplary repeating unit in FIG. 15 may be used to form the pixel structure as shown in FIG. 16.

As shown in FIG. 15, the fourth repeating unit may be rapidly arranged in the vertical direction to form a pixel structure. As shown in FIGS. 12-13, the third repeating unit may be rapidly arranged in the horizontal direction to form a pixel structure Depending on specific applications, pixel structures may be formed by the third exemplary repeating unit in FIGS. 12-13, and/or the fourth exemplary repeating unit in FIG. 15.

In various embodiments, subpixels in the isosceles triangular shape may include equilateral triangular subpixels. The equilateral triangular subpixels may provide uniform distribution of subpixels and may ensure uniform color display.

In various embodiments, the blue, red and green subpixels are made of organic light emitting material.

The present disclosure also provides a display panel. The display panel may include any of the disclosed pixel structures. In various embodiments, the disclosed display panel may be an OLED display panel. An OLED display panel may include an array substrate.

The present disclosure also provides a display apparatus. The display apparatus may include a disclosed display panel.

The disclosed display apparatus may include, for example, an electronic paper display apparatus, a smart phone, a tablet computer, a television, a laptop computer, a digital picture frame, a navigation device, or any products or components with display function.

In the above description, the terms "first", "second', "third" and "fourth" are for illustration purpose only. No relative priority or emphasis may be implied. The term "plurality" refers two or more, unless otherwise defined.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A pixel structure, comprising a plurality of subpixels, wherein:
   the subpixels include red subpixels, green subpixels, and blue subpixels,
   the red subpixels and the green subpixels are all substantially in an isosceles triangular shape and have substantially a same area,
   each blue subpixel is in substantially a rhombic shape and has an area substantially twice the area of the red subpixel,
   each leg of the isosceles triangular shape of the red or green subpixel has a length equal to a side length of the rhombic shape of the blue subpixel, and
   the subpixels have an arrangement in which:
      two of the red subpixels that are adjacent to one blue subpixel are symmetric to each other with respect to a diagonal line of the one blue subpixel, and/or
      two of the green subpixels that are adjacent to the one blue subpixel are symmetric to each other with respect to the diagonal line of the one blue subpixel.

2. The pixel structure of claim 1, wherein two of the red subpixels and two of the green subpixels are respectively arranged against four sides of the rhombic shape of the blue subpixel.

3. The pixel structure of claim 2, wherein the pixel structure includes a plurality of logical pixels that are in a triangular shape, an arrow shape, a parallelogram shape, or a rectangular shape.

4. The pixel structure of claim 3, wherein each logical pixel is in the rectangular shape formed by a half red subpixel, a half green subpixel, and a half blue subpixel, and wherein a leg of the half red subpixel and a leg of the green subpixel are arranged against adjacent sides of the half blue subpixel, so as to form the rectangular shape.

5. The pixel structure of claim 3, wherein each logical pixel is in the triangular shape having one leg of the red subpixel and one leg of the green subpixel arranged against adjacent sides of the blue subpixel, and wherein one base angle of the red subpixel is connected to one base angle of the green subpixel.

6. The pixel structure of claim 3, wherein each logical pixel is in the arrow shape having one leg of the red subpixel and one leg of the green subpixel arranged against adjacent sides of the blue subpixel, and wherein vertex angles of the red subpixel and the green subpixel are connected to one another.

7. The pixel structure of claim 3, wherein each logical pixel is in the parallelogram shape having one leg of the red subpixel and one leg of the green subpixel arranged against opposite sides of the blue subpixel.

8. The pixel structure of claim 3, wherein:
the plurality of logical pixels are all substantially in a triangular shape,
the plurality of logical pixels include a plurality of first logical pixels and a plurality of second logical pixels,
in the first logical pixel, the red subpixel is located at a lower left corner of the blue subpixel and the green subpixel is located at a lower right corner of the blue subpixel, and
in the second logical pixel, the red subpixel is located at an upper right corner of the blue subpixel and the green subpixel is located in an upper left corner of the blue subpixel.

9. The pixel structure of claim 8, further comprising:
a plurality of first repeating units arranged in a pre-set layout, wherein:
the first repeating unit includes the first logical pixel and the second logical pixel, that are horizontally arranged, and
a side of the first logical pixel is arranged against a side of the second logical pixel.

10. The pixel structure of claim 8, further comprising:
a plurality of second repeating units arranged in a pre-set layout, wherein:
the second repeating unit includes the first logical pixel and the second logical pixel, that are vertically arranged, and
a bottom side of the first logical pixel is arranged against a bottom side of the second logical pixel.

11. The pixel structure of claim 3, wherein:
the plurality of logical pixels are all substantially in a triangular shape,
the plurality of logical pixels include a plurality of third logical pixels and a plurality of fourth logical pixels,
in the third logical pixel, the green subpixel is located at a lower left corner of the blue subpixel and the red subpixel is located at a lower right corner of the blue subpixel, and
in the fourth logical pixel, the green subpixel is located at an upper right corner of the blue subpixel and the red subpixel is located in an upper left corner of the blue subpixel.

12. The pixel structure of claim 11, further comprising:
a plurality of third repeating units arranged in a pre-set layout, wherein:
the third repeating unit includes the third logical pixel and the fourth logical pixel, that are horizontally arranged, and
a side of the third logical pixel is arranged against a side of the fourth logical pixel.

13. The pixel structure of claim 11, further comprising:
a plurality of fourth repeating units arranged in a pre-set layout, wherein:
the fourth repeating unit includes the third logical pixel and the fourth logical pixel, that are vertically arranged, and
a bottom side of the third logical pixel is arranged against a bottom side of the fourth logical pixel.

14. The pixel structure of claim 1, wherein:
the blue subpixel in substantially the rhombic shape is a single subpixel.

15. The pixel structure of claim 1, wherein:
the blue subpixel in substantially the rhombic shape includes two separate isosceles triangular shapes each having a shape substantially same as the isosceles triangular shape of the red subpixel or the green subpixel.

16. The pixel structure of claim 1, wherein the isosceles triangular shape for the red subpixel or the green subpixel has an equilateral triangular shape.

17. A display panel, comprising the pixel structure of claim 1.

18. A display apparatus, comprising the display panel of claim 17.

* * * * *